United States Patent [19]
Chiang et al.

[11] Patent Number: 6,071,831
[45] Date of Patent: Jun. 6, 2000

[54] METHOD OF REDUCING SPIRAL DEFECTS BY ADDING AN ISOPROPYL ALCOHOL RINSE STEP BEFORE DEPOSITING SOG

[75] Inventors: Chen-Chia Chiang, Hsien; Chung-An Lin, Hsin-chu, both of Taiwan

[73] Assignee: Taiwan Semiconductor Manufacturing Company, Hsin-Chu, Taiwan

[21] Appl. No.: 09/135,042

[22] Filed: Aug. 17, 1998

[51] Int. Cl.$^7$ .......................... H01L 21/31; H01L 21/469
[52] U.S. Cl. .......................... 438/778; 438/782; 438/906
[58] Field of Search .................................... 438/778, 782, 438/906

[56] References Cited

U.S. PATENT DOCUMENTS

| | | |
|---|---|---|
| 5,264,246 | 11/1993 | Ikeno . |
| 5,272,118 | 12/1993 | Ziger . |
| 5,535,525 | 7/1996 | Gardner ........................................ 34/78 |
| 5,646,071 | 7/1997 | Lin et al. . |
| 5,780,105 | 7/1998 | Wang . |
| 5,807,792 | 9/1998 | Ilg et al. . |
| 5,843,527 | 12/1998 | Sanada . |
| 5,874,128 | 2/1999 | Kim . |
| 5,912,049 | 6/1999 | Shirley . |
| 5,925,410 | 7/1999 | Akram et al. . |
| 5,990,014 | 11/1999 | Wilson et al. . |
| 6,004,622 | 12/1999 | Yen et al. . |
| 6,022,806 | 2/2000 | Sato et al. . |

OTHER PUBLICATIONS

Chang et al, "ULSI Technology", McGraw–Hill Companies Inc, 1996, pp. 92–93.

*Primary Examiner*—John F. Niebling
*Assistant Examiner*—Josetta Jones
*Attorney, Agent, or Firm*—George O. Saile; Stephen B. Ackerman; Larry J. Prescott

[57] ABSTRACT

A method of forming an interlevel dielectric slayer of spin-on-glass is described which avoids spiral defects from occurring in the layer of spin-on-glass. Before the spin-on-glass is deposited and with the wafer spinning at a low angular velocity a first volume of isopropyl alcohol is deposited on the wafer. The wafer continues to spin at the low angular velocity for a short time. With the wafer continuing to spin at the low angular velocity a second volume, less than the first volume, of spin-on-glass is deposited on the wafer. The wafer continues to spin at the low angular velocity for a short time and then is spun at a high angular velocity for a longer time. The wafer is then removed from the apparatus used to deposit the spin-on-glass and processing of the wafer continues. Spiral defects in the layer of spin-on-glass are avoided.

20 Claims, 4 Drawing Sheets

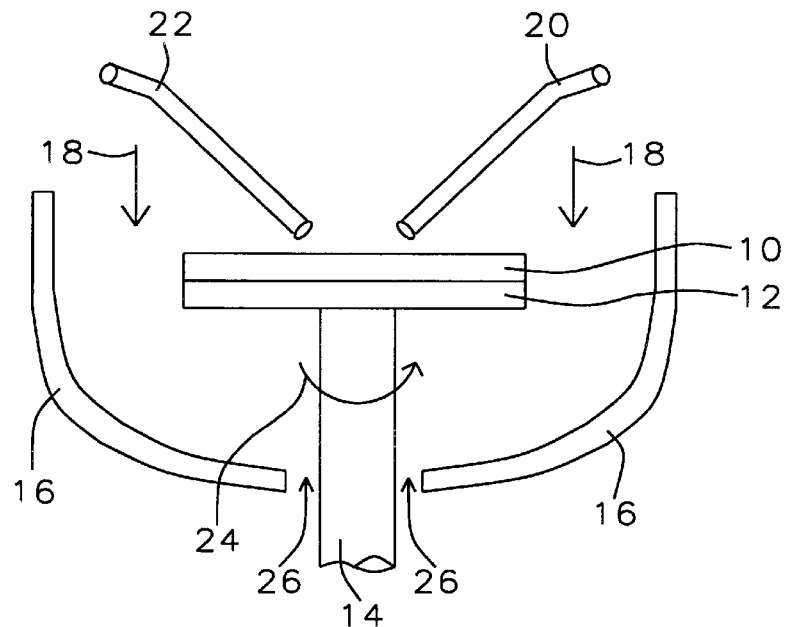
FIG. 1
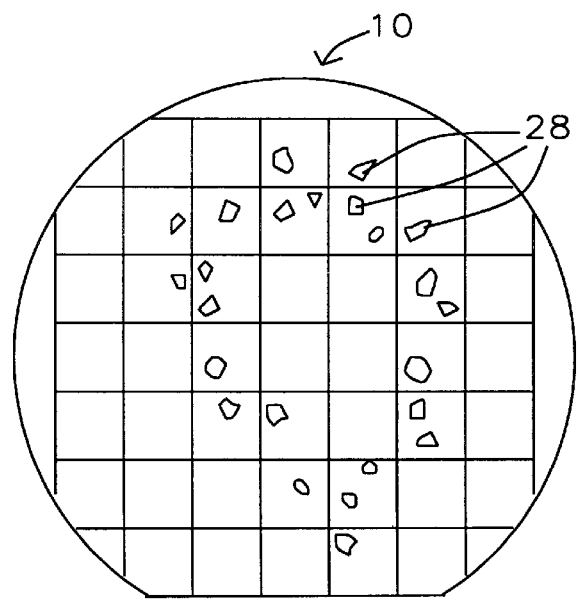
FIG. 2 – Prior Art

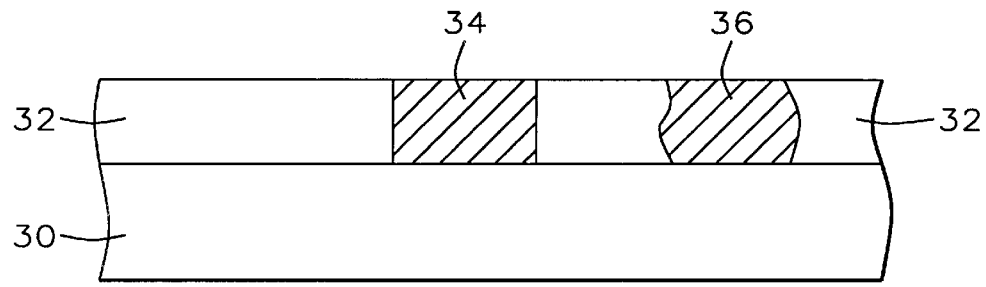
FIG. 3 — Prior Art
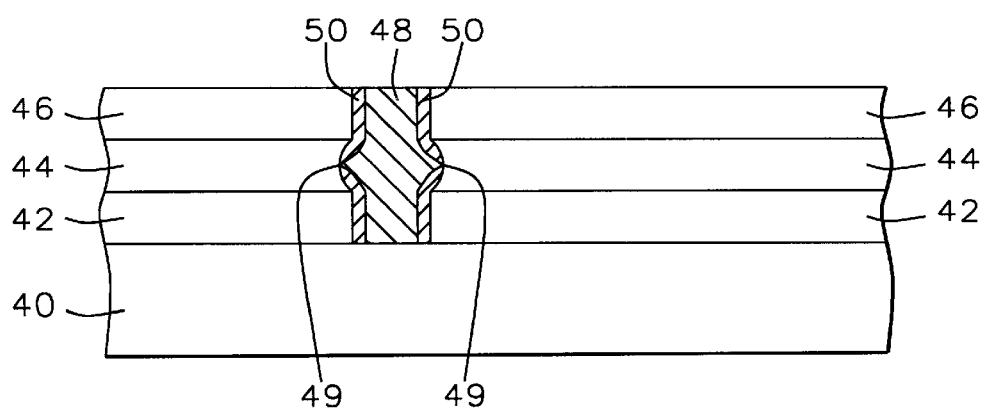
FIG. 4 — Prior Art

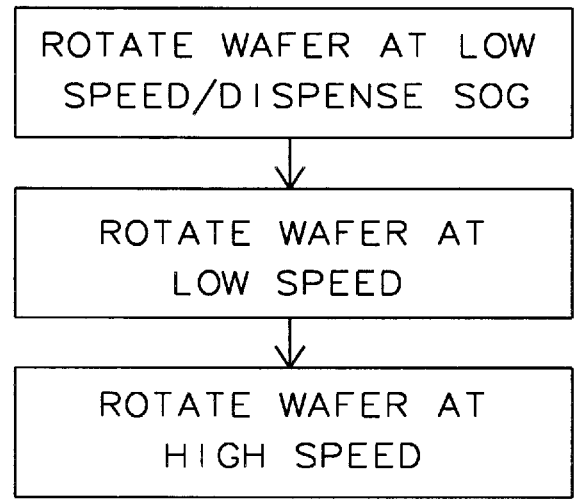
FIG. 5 – Prior Art
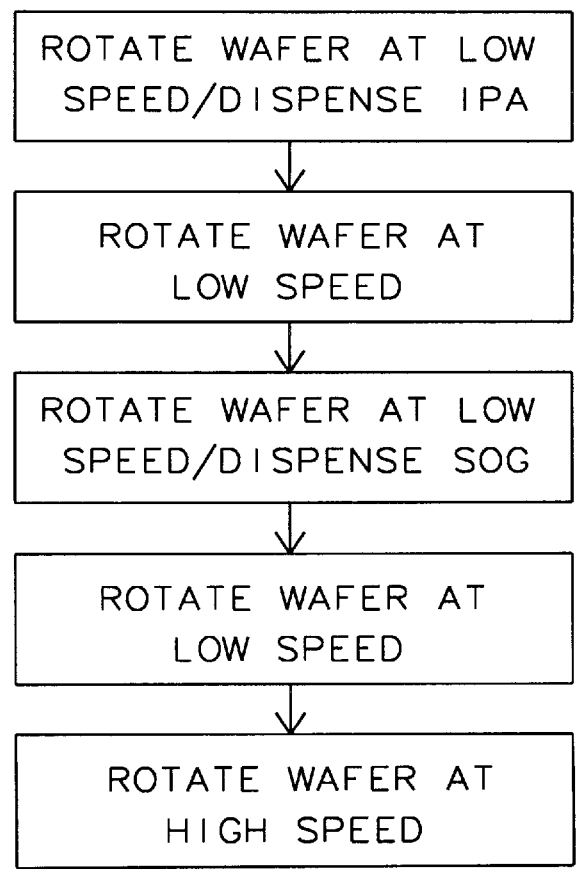
FIG. 6

METHOD OF REDUCING SPIRAL DEFECTS BY ADDING AN ISOPROPYL ALCOHOL RINSE STEP BEFORE DEPOSITING SOG

BACKGROUND OF THE INVENTION

(1) Field of the Invention

This invention relates to a method of reducing spiral defects in a layer of spin-on-glass used as an interlevel dielectric and more particularly to the introduction of an isopropyl alcohol rinse step just prior the deposition of the spin-on-glass.

(2) Description of the Related Art

Spin-on-glass is frequently used as an interlevel dielectric in the fabrication of integrated circuit wafers and spiral defects frequently occur in the spin-on-glass layer. This invention uses an isopropyl alcohol rinse step to reduce spiral defects.

U.S. Pat. No. 5,535,525 to Gardner describes a isopropyl alcohol tank and cleaning tool used for cleaning wafers.

The book "ULSI Technology" by C. Y. Chang and S. M. Sze, Mc-Graw Hill Companies, Inc., 1997, pages 92–93 discusses wafer cleaning and the use of isopropyl alcohol vapor for wafer drying.

SUMMARY OF THE INVENTION

Spin-on-glass is frequently used as an interlevel dielectric in the fabrication of integrated circuit wafers. The spin-on-glass is deposited using an apparatus such as that shown schematically in FIG. 1 and a process flow such as that shown in FIG. 5. An integrated circuit wafer 10 is placed on a wafer holder 12 attached to a shaft 14. The shaft 14 is attached to a motor, not shown, and given an angular velocity, ω, indicated by the arrow 24. The rotating shaft 14 transmits the angular velocity, ω, to both the wafer holder 12 and the wafer 10. A volume of uncured spin-on-glass is deposited using a nozzle 20 as the wafer 10 is spinning at a first angular velocity. The shaft 14, wafer holder 12, and wafer 10 are placed in a cup 16 with exhaust gas 18 flowing into the cup 16 at the top and out of the cup 16 through an exhaust port 26 at the bottom of the cup 16.

After the uncured spin-on-glass has been deposited on the wafer 10 the wafer continues to spin at the first angular velocity briefly. The wafer is then spun at a second, and larger, angular velocity. The spinning of the wafer is then stopped and the wafer is removed to complete the curing of the spin-on-glass and subsequent processing steps on the wafer.

One problem with this method of forming a layer of spin-on-glass is that defects are frequently formed in the spin-on-glass layer. These defects often form a spiral pattern on the wafer as shown in FIG. 2. FIG. 2 shows a top view of a wafer 10, after a layer of spin-on-glass has been formed, showing the defects 28 occurring in a spiral pattern.

The effects of these defects is shown in FIGS. 3 and 4. FIG. 3 shows a cross section of a wafer 30 with a spin-on-glass 32 interlevel dielectric layer with a via hole filled with a metal 34. The defect acts like a via hole and is also filled with metal 36 which can cause subsequent electrical shorting or other problems. FIG. 4 shows the problem that can occur when the defect occurs where the via hole is formed. FIG. 4 shows a cross section of a wafer 40 with a first oxide layer 42 a spin-on-glass layer 44, and a second oxide layer 46. The via hole is lined with a metal adhesion layer 50, such as titanium nitride, and filled with a metal plug 48, such as tungsten. The defect distorts the sidewall 49 of the via in the spin-on-glass layer 44 causing poor adhesion of the metal adhesion layer 50 to the sidewall 49 of the via in the spin-on-glass layer 44.

It is a principle objective of this invention to provide a method of depositing a layer of spin-on-glass which avoids the problem of spiral defects in the spin-on-glass layer.

This objective is achieved by depositing a volume of cleaning solution, such as isopropyl alcohol, on the wafer, after the wafer has been placed on the wafer holder and before the uncured spin-on-glass is deposited, while the wafer is spinning at a first angular velocity. After the cleaning solution has been deposited the wafer continues to spin at the first angular velocity briefly. A volume of uncured spin-on-glass is then deposited on the wafer while the wafer is spinning at the first angular velocity. The volume of cleaning solution is larger than the volume of uncured spin-on-glass.

After the uncured spin-on-glass has been deposited on the wafer the wafer continues to spin at the first angular velocity briefly. The wafer is then spun at a second, and larger, angular velocity. The spinning of the wafer is then stopped and the wafer is removed to complete the curing of the spin-on-glass and subsequent processing steps on the wafer.

BRIEF DESCRIPTION OF THE DRAWINGS

FIG. 1 shows a schematic view of an apparatus for depositing spin-on-glass on a wafer.

FIG. 2 shows a top view of a wafer after a layer of spin-on-glass has been deposited showing the spiral pattern of defects.

FIG. 3 shows a cross section of a wafer having a layer of spin-on-glass with formed on the wafer, wherein the layer of spin-on-glass has defects at locations apart from via holes.

FIG. 4 shows a cross section of a wafer having a layer of spin-on-glass with formed on the wafer, wherein the layer of spin-on-glass has defects at the location of via holes.

FIG. 5 shows a process flow diagram of a conventional method of depositing a layer of spin-on-glass.

FIG. 6 shows a process flow diagram of the method of this invention for depositing a layer of spin-on-glass.

DESCRIPTION OF THE PREFERRED EMBODIMENTS

Figure 7:
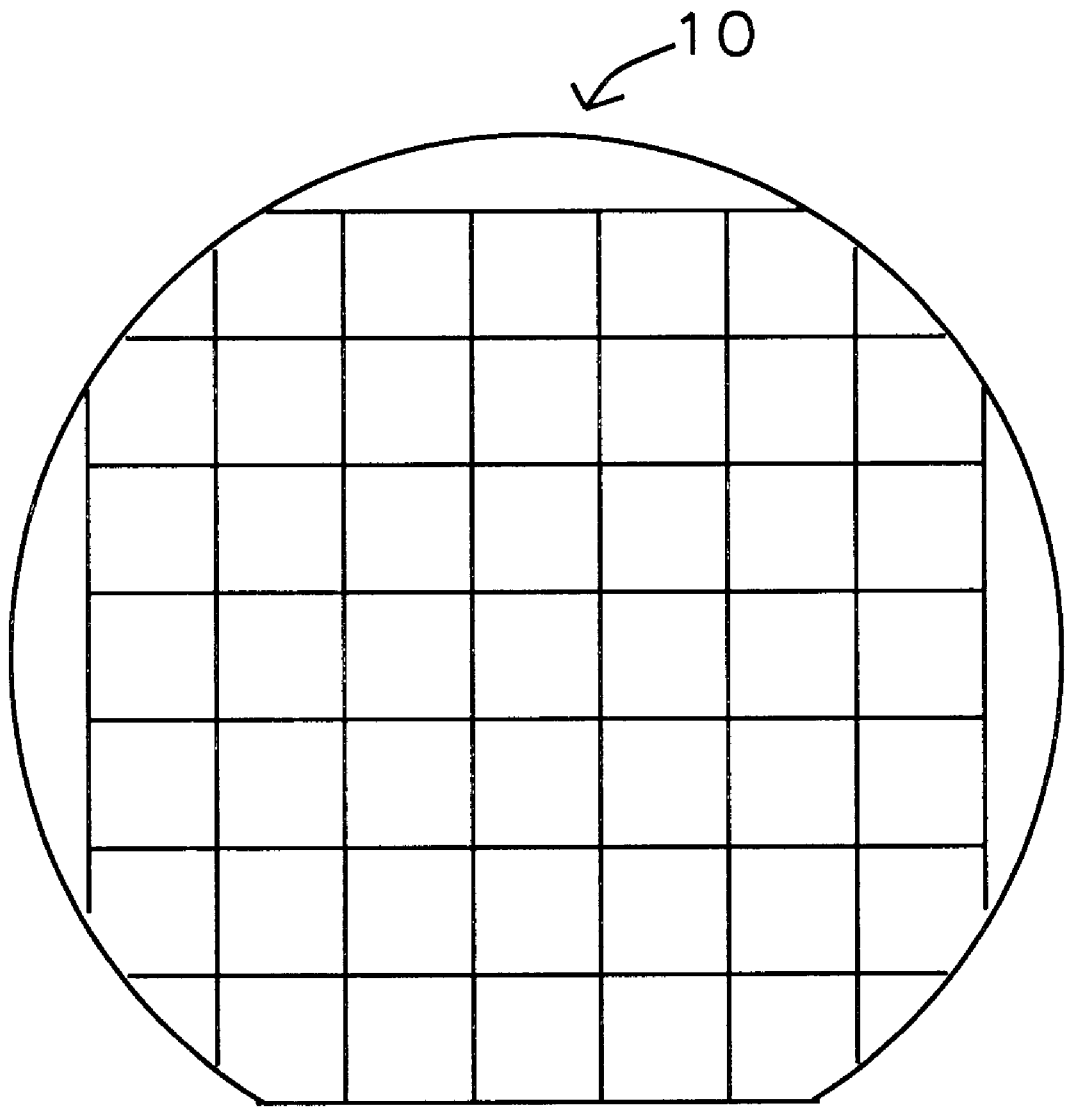
FIG. 7 shows a top view of a wafer after a layer of spin-on-glass has been deposited using the method of this invention showing the absence of spiral pattern defects.

Refer now to FIGS. 1, 6, and 7 for a description of the preferred embodiment of this invention. FIG. 1 shows a schematic view of an apparatus for depositing a layer of uncured dielectric, such as uncured spin-on-glass, on a substrate, such as an integrated circuit wafer. The integrated circuit wafer may have devices formed therein and layers of patterned conductor material and dielectric formed thereon. The substrate 10, in this example and integrated circuit wafer, is placed on a wafer holder 12 and held in place. The wafer holder 12 is attached to a shaft 14. The shaft 14 is attached to a motor, not shown, and given an angular velocity, ω, indicated by the arrow 24. The rotating shaft 14 transmits the angular velocity, ω, to both the wafer holder 12 and the wafer 10. The shaft 14, wafer holder 12, and wafer 10 are placed in a cup 16 with exhaust gas 18 flowing into the cup 16 at the top and out of the cup 16 through an exhaust port 26 at the bottom of the cup 16.

The following steps are the key part of the method of this invention for depositing a layer of spin-on-glass on a wafer.

As the wafer is rotated at a first angular velocity a first volume of solvent is deposited on the wafer through a first nozzle 22, see FIGS. 1 and 6. In this example the solvent is isopropyl alcohol or a solvent comprising isopropanol, ethyl alcohol, methylsiloxane, n-butyl alcohol, and water. The first volume in this example is between about 4.5 and 5.5 cubic centimeters. The first angular velocity in this example is a low speed and is between about 325 and 395 revolutions per minute. After the first volume of solvent has been deposited the wafer continues to spin for a first time, in this example between about 0.15 and 0.25 seconds, see FIG. 6.

Next, as shown in FIGS. 1 and 6, with the wafer 10 rotating at the first angular velocity, in this example between about 325 and 395 revolutions per minute, a second volume of uncured dielectric is deposited on the wafer 10 through a second nozzle 20. The second volume is less than the first volume and in this example is between about 3 and 4 cubic centimeters. In this example the uncured dielectric is uncured spin-on-glass. After the second volume of uncured dielectric, in this example uncured spin-on-glass, has been deposited the wafer continues to spin for a second time, in this example between about 0.15 and 0.25 seconds, see FIG. 6. The wafer is then rotated at a second angular velocity, greater than the first angular velocity, for a third time, see FIG. 6. In this example the second angular velocity is between about 2700 and 3300 revolutions per minute and the third time is between about 8 and 12 seconds.

The wafer is then removed from the wafer holder for further processing including the curing of the dielectric. Using this method the spiral defects in the layer of spin-on-glass are avoided. FIG. 7. shows a top view of the wafer 10 free of spiral defects. Measurements made on wafers having the spin-on-glass deposited without the solvent deposition step of this invention indicated between 300 and 36,000 spiral defects in the layer of spin-on-glass per wafer. Measurements made on wafers having the spin-on-glass deposited with the solvent deposition step of this invention indicated less than 20 spiral defects in the layer of spin-on-glass per wafer.

While the invention has been particularly shown and described with reference to the preferred embodiments thereof, it will be understood by those skilled in the art that various changes in form and details may be made without departing from the spirit and scope of the invention.

What is claimed is:

1. A method of forming a dielectric on a substrate, comprising the steps of:
    providing a substrate having a first surface and an axis, wherein said axis is at the center of and perpendicular to said first surface of said substrate;
    providing means for rotating said substrate about said axis;
    placing said substrate on said means for rotating said substrate about said axis;
    rotating said substrate about said axis at a first angular velocity while depositing a first volume of cleaning solution on said first surface of said substrate;
    rotating said substrate about said axis at said first angular velocity for a first time after said first volume of cleaning solvent has been deposited on said first surface of said substrate;
    rotating said substrate about said axis at said first angular velocity while depositing a second volume of uncured dielectric on said first surface of said substrate, wherein said second volume is less than said first volume;
    rotating said substrate about said axis at said first angular velocity for a second time after said second volume of uncured dielectric has been deposited on said first surface of said substrate;
    rotating said substrate about said axis at a second angular velocity for a third time after said second volume of uncured dielectric has been deposited on said first surface of said substrate and said substrate has been rotated about said axis at said first angular velocity for said second time; and
    removing said substrate from said means for rotating said substrate about said axis.

2. The method of claim 1 wherein said substrate is an integrated circuit wafer.

3. The method of claim 1 wherein said uncured dielectric is uncured spin-on-glass.

4. The method of claim 1 wherein said first volume is between about 4.5 and 5.5 cubic centimeters.

5. The method of claim 1 wherein said second volume is between about 3 and 4 cubic centimeters.

6. The method of claim 1 wherein said cleaning solution is isopropyl alcohol.

7. The method of claim 1 wherein said cleaning solution comprises isopropanol, ethyl alcohol, methylsiloxane, n-butyl alcohol, and water.

8. The method of claim 1 wherein said first angular velocity is between about 325 and 395 revolutions per minute.

9. The method of claim 1 wherein said second angular velocity is between about 2700 and 3300 revolutions per minute.

10. The method of claim 1 wherein said first time is between about 0.15 and 0.25 seconds.

11. The method of claim 1 wherein said second time is between about 0.15 and 0.25 seconds.

12. The method of claim 1 wherein said third time is between about 8 and 12 seconds.

13. A method of forming a dielectric on an integrated circuit wafer, comprising the steps of:
    providing an integrated circuit wafer having a first surface and an axis, wherein said axis is at the center of and perpendicular to said first surface of said integrated circuit wafer;
    providing means for rotating said integrated circuit wafer about said axis;
    placing said integrated circuit wafer on said means for rotating said integrated circuit wafer about said axis;
    rotating said integrated circuit wafer about said axis at a first angular velocity while depositing a first volume of cleaning solution on said first surface of said integrated circuit wafer;
    rotating said integrated circuit wafer about said axis at said first angular velocity for a first time after said first volume of cleaning solvent has been deposited on said first surface of said integrated circuit wafer;
    rotating said integrated circuit wafer about said axis at said first angular velocity while depositing a second volume of uncured spin-on-glass on said first surface of said integrated circuit wafer, wherein said second volume is less than said first volume;
    rotating said integrated circuit wafer about said axis at said first angular velocity for a second time after said second volume of uncured spin-on-glass has been deposited on said first surface of said integrated circuit wafer;
    rotating said integrated circuit wafer about said axis at a second angular velocity for a third time after said second volume of uncured spin-on-glass has been deposited on said first surface of said integrated circuit wafer and said integrated circuit wafer has been rotated about said axis at said first angular velocity for said second time; and removing said integrated circuit wafer from said means for rotating said integrated circuit wafer about said axis.

14. The method of claim 13 wherein said first volume is between about 4.5 and 5.5 cubic centimeters.

15. The method of claim 13 wherein said second volume is between about 3 and 4 cubic centimeters.

16. The method of claim 13 wherein said cleaning solution is isopropyl alcohol.

17. The method of claim 13 wherein said cleaning solution comprises isopropanol, ethyl alcohol, methylsiloxane, n-butyl alcohol, and water.

18. The method of claim 13 wherein said first angular velocity is between about 325 and 395 revolutions per minute.

19. The method of claim 13 wherein said second angular velocity is between about 2700 and 3300 revolutions per minute.

20. The method of claim 13 wherein said first time is between about 0.15 and 0.25 seconds, said second time is between about 0.15 and 0.25 seconds, and said third time is between about 8 and 12 seconds.

* * * * *